(12) United States Patent
Chow et al.

(10) Patent No.: US 8,198,735 B2
(45) Date of Patent: Jun. 12, 2012

(54) INTEGRATED CIRCUIT PACKAGE WITH MOLDED CAVITY

(75) Inventors: Seng Guan Chow, Singapore (SG); Il Kwon Shim, Singapore (SG); Byung Joon Han, Singapore (SG)

(73) Assignee: Stats Chippac Ltd., Singapore (SG)

( * ) Notice: Subject to any disclaimer, the term of this patent is extended or adjusted under 35 U.S.C. 154(b) by 1152 days.

(21) Appl. No.: 11/670,714

(22) Filed: Feb. 2, 2007

(65) Prior Publication Data
US 2008/0157325 A1 Jul. 3, 2008

Related U.S. Application Data

(60) Provisional application No. 60/882,930, filed on Dec. 31, 2006.

(51) Int. Cl.
*H01L 29/40* (2006.01)
(52) U.S. Cl. ......................... 257/777; 438/108
(58) Field of Classification Search .................. 257/777
See application file for complete search history.

(56) References Cited

U.S. PATENT DOCUMENTS

| | | | |
|---|---|---|---|
| 6,555,898 B2 | 4/2003 | Wensel | |
| 6,696,748 B1 | 2/2004 | Thurgood | |
| 6,855,574 B2 | 2/2005 | Thurgood | |
| 6,861,288 B2 | 3/2005 | Shim et al. | |
| 7,169,645 B2 | 1/2007 | Bolken et al. | |
| 2002/0030261 A1* | 3/2002 | Rolda et al. | 257/685 |
| 2005/0090050 A1* | 4/2005 | Shim et al. | 438/200 |
| 2006/0240595 A1* | 10/2006 | Lee et al. | 438/108 |
| 2007/0278696 A1 | 12/2007 | Lu et al. | |

FOREIGN PATENT DOCUMENTS
JP 2000-228468 A 8/2000
* cited by examiner

*Primary Examiner* — Thao Le
*Assistant Examiner* — Kimberly Trice
(74) *Attorney, Agent, or Firm* — Ishimaru & Associates LLP; Mikio Ishimaru; Stanley Chang

(57) ABSTRACT

An integrated circuit package system includes a base substrate, attaching a base die over the base substrate, attaching an integrated interposer having interposer circuit devices, over the base die, and forming a package system encapsulant having an encapsulant cavity over the integrated interposer on a side opposite the base die.

12 Claims, 8 Drawing Sheets

INTEGRATED CIRCUIT PACKAGE WITH MOLDED CAVITY

CROSS-REFERENCE TO RELATED APPLICATION

This application claims the benefit of U.S. Provisional Patent Application No. 60/882,930 filed Dec. 31, 2006.

This application contains subject matter related to U.S. patent application Ser. No. 11/306,628 filed Jan. 4, 2006 now U.S. Pat. No. 7,364,945. The related application is assigned to STATS ChipPAC Ltd.

TECHNICAL FIELD

The present invention relates generally to integrated circuit package systems, and more particularly to a system for integrated circuit packages with mold caps.

BACKGROUND ART

Electronic devices such as smart phones, personal digital assistants, location based devices, digital cameras, music players, computers, or transportation, have become an integral part of many daily activities. Key components of these electronic devices are integrated circuit devices. These tiny integrated circuits must perform during daily activities including a wide variety of environmental conditions as well as potentially damaging forces. Many and varied types of packaging, intended for protection, interconnection or mounting, have been developed for integrated circuit devices.

Integrated circuit dies are conventionally enclosed in plastic packages that provide protection from hostile environments and enable electrical interconnection between the integrated circuit die and an underlying substrate such as a printed circuit board (PCB). The elements of such a package include: a lead frame or substrate, an integrated circuit die, bonding material to attach the integrated circuit die to the lead frame or substrate, bond wires or other connectors that electrically connect pads on the integrated circuit die to the lead frame or substrate. The package can also include a plastic or other insulating material that covers the components and forms the exterior of the package.

Wafer manufacturing strives to reduce transistor or capacitor feature size in order to increase circuit density and enhance functionality. Device geometries with sub-micron line widths are so common that individual chips routinely contain millions of electronic devices. Reduced feature size has been quite successful in improving electronic systems, and continuous development is expected in the future. However, significant obstacles to further reduction in feature size are being encountered. These obstacles include defect density control, optical system resolution limits, and availability of processing material and equipment. Attention has therefore increasingly shifted to semiconductor packaging as a means to fulfill the relentless demands for enhanced system performance.

Drawbacks of conventional designs include a relatively large footprint of the package on the mounting surface of motherboard. The footprint reflects dimensions that are typically the maximum of the package, namely, the maximum x-y dimensions of the package. In applications where mounting space is at a premium, such as pagers, portable telephones, and personal computers, among others, a large footprint is undesirable. With the goal of increasing the amount of circuitry in a package, but without increasing the area of the package so that the package does not take up any more space on the circuit board, manufacturers have been stacking two or more die within a single package. Unfortunately, sufficient overlap for electrical interconnect, large footprint top packages, increased device integration, pre-testing, and interconnect lengths have plagued previous package designs.

Thus, a need still remains for an integrated circuit package system to improve area and volume. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a base substrate, attaching a base die over the base substrate, attaching an integrated interposer having interposer circuit devices, over the base die, and forming a package system encapsulant having an encapsulant cavity over the integrated interposer on a side opposite the base die.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
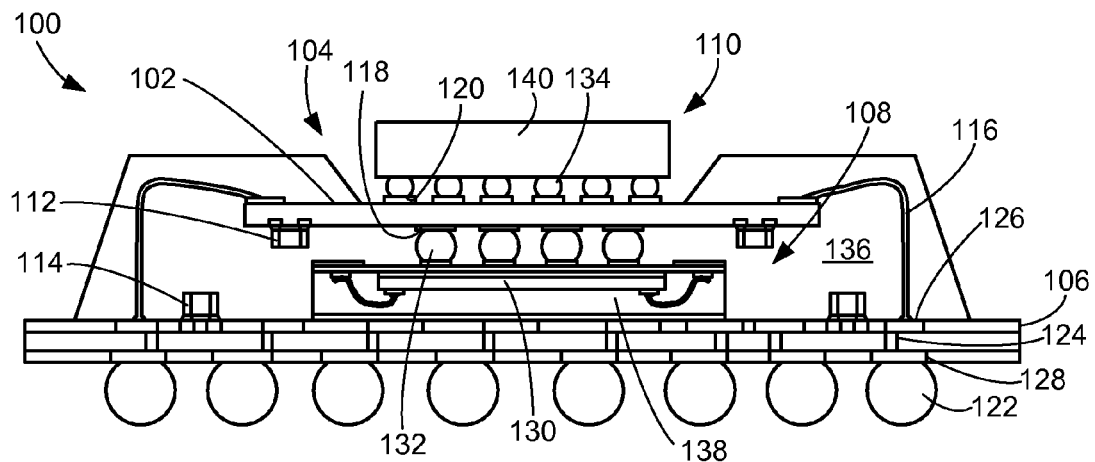
FIG. 1 is a cross-sectional view of an integrated circuit package system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Referring now to FIG. 1, therein is shown a cross-sectional view of an integrated circuit package system 100 in an embodiment of the present invention. The integrated circuit package system 100 can include an integrated interposer 102, an encapsulant cavity 104, a base substrate 106, a base package 108, a top package 110, interposer circuit devices 112, such as passive devices, or base circuit devices 114, such as passive devices. The integrated interposer 102 provides support and structural integrity for stacking the top package 110 over the base package 108. The interposer circuit devices 112 are pre-attached, such as pre-mounted, over the integrated interposer 102 providing clearance for an attaching process, such as a mounting process. The base circuit devices 114 can also be pre-mounted over the base substrate 106.

The integrated interposer 102 can be formed of materials such as a flexible tape, a rigid laminate epoxy resin, ceramic, or low dielectric materials. A thin vertical dimension of the integrated interposer 102 can reduce overall height of the integrated circuit package system 100. The integrated interposer 102 can include interposer connectors 116, interposer inner connections 118, such as pads, or interposer outer connections 120, such as pads. The interposer inner connections 118 can provide electrical connectivity to the base package 108. The interposer outer connections 120 can provide electrical connectivity to the top package 110. The interposer connectors 116 can connect the integrated interposer 102 to the base substrate 106.

The base substrate 106 can also include base substrate connectors 122, base substrate routing 124, base substrate inner connections 126, or base substrate outer connections 128. The base substrate routing 124 such as redistribution layers or vias, connects the base substrate inner connections 126 and the base substrate outer connections 128. The base substrate inner connections 126 can provide electrical connectivity to the interposer connectors 116 or the base package 108. The base substrate outer connections 128 can provide electrical connectivity to the base substrate connectors 122. The base substrate connectors 122 can connect the base substrate 106 to a next level system, such as a printed circuit board.

The base package 108 can include a base die 130, or base package connectors 132. The base package connectors 132 can connect the base die 130 to a next level system such as the integrated interposer 102. The top package 110 can include a top die (not shown), or top package connectors 134. The top package connectors 134 can connect the top die to a next level system such as the integrated interposer 102. The integrated circuit package system 100 can also include a package system encapsulant 136, a base package encapsulant 138, or a top package encapsulant 140.

For illustrative purposes, the base package 108 is shown as a wire bonded package, although it is understood that the base package 108 may be different. Further, for illustrative purposed, one instance of the base package 108 is shown although it is understood that any number of the base package 108 may be included. Yet further, for illustrative purposes, the top package 110 is shown as an area array package, although it is understood that the top package 110 may be different. Yet further, for illustrative purposes, one instance of the top package 110 is shown although it is understood that any number of the top package 110 may be included.

It has been discovered that the integrated interposer 102 having the interposer inner connections 118, the interposer outer connections 120, and the interposer circuit devices 112 pre-mounted, provides a smaller form factor and improved integration of the integrated circuit package system 100.

Figure 2:
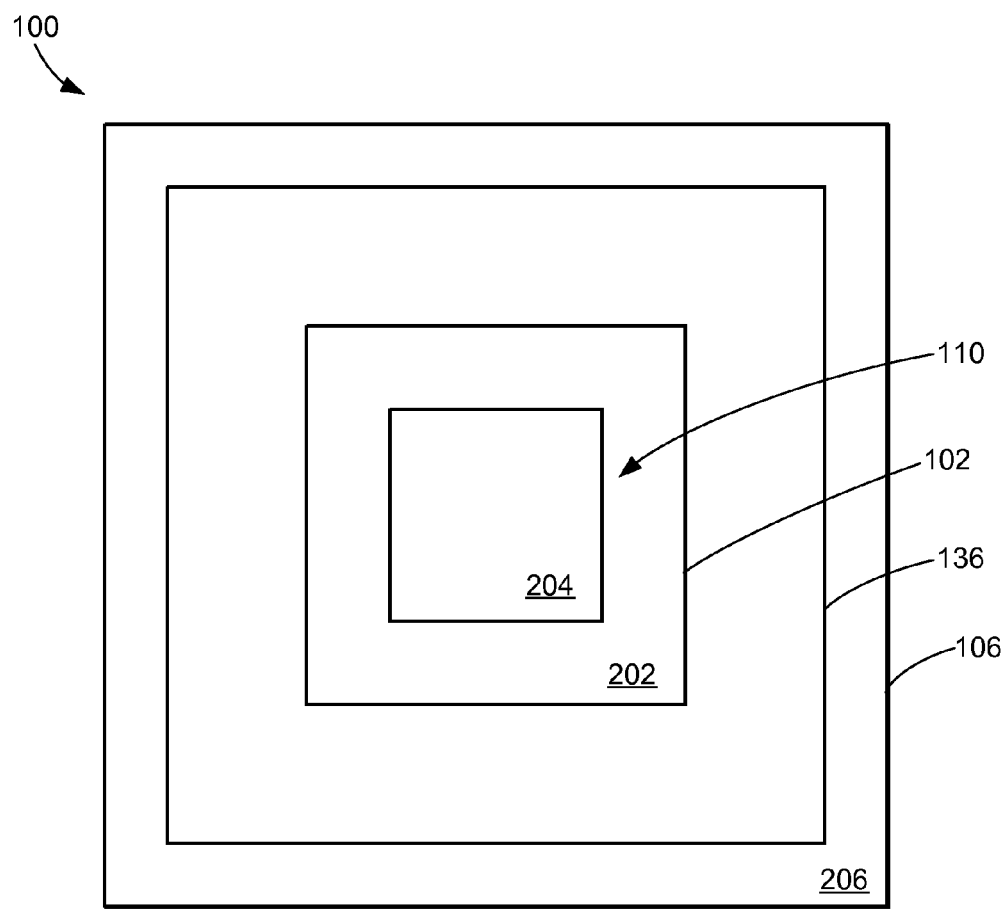
FIG. 2 is a top plan view of the integrated circuit package system.

Referring now to FIG. 2, therein is shown a top plan view of the integrated circuit package system 100. The integrated circuit package system 100 includes the top package 110, the integrated interposer 102 having an interposer first surface 202, the package system encapsulant 136, and the base substrate 106. The top package encapsulant 140 can form a top package cap 204 over the top package 110. The top package 110 can be mounted over the interposer first surface 202.

The interposer first surface 202 provides compatibility with a wide range of dimensions for the top package 110. The integrated interposer 102 provides connectivity for the wide range of planar dimensions for the top package 110 including planar dimensions of the top package 110 smaller than planar dimensions of the base package 108. Smaller planar dimensions of the top package 110 can also improve total manufacturing costs, such as reduced materials, higher throughput, or increased yield.

Due to the compatibility with the wide range of dimensions, the interposer first surface 202 can optionally be exposed between the top package 110 and the package system encapsulant 136. The package system encapsulant 136 can be formed over the interposer first surface 202 of the integrated interposer 102 and a substrate top surface 206 of the base substrate 106. Forming the package system encapsulant 136 can optionally provide a portion of the substrate top surface 206 exposed.

Figure 3:
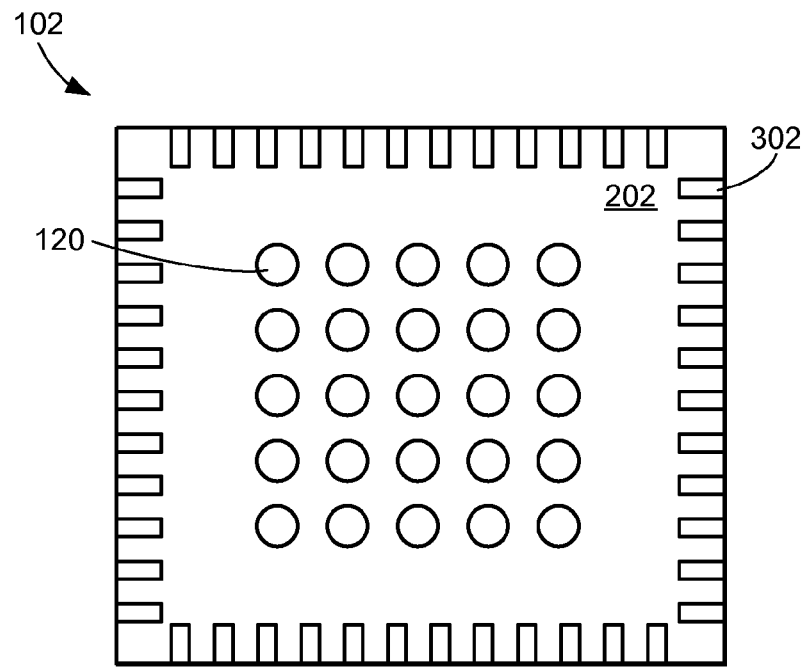
FIG. 3 is a top plan view of the first interposer surface of the integrated interposer.

Referring now to FIG. 3, therein is shown a top plan view of the interposer first surface 202 of the integrated interposer 102. The interposer first surface 202 can include the interposer outer connections 120, such as terminal pads for mounting components, and interposer outer leads 302, such as bond fingers for wire bonding. The integrated interposer 102 can include electrical routing, such as redistribution layers or vias, (not shown) between any of the interposer outer connections 120 and any of the interposer outer leads 302. The electrical routing can provide connectivity between the interposer outer connections 120 and the interposer outer leads as well as interconnections between components, such as the base package 108, the top package 110, or the interposer circuit devices 112.

The interposer outer leads 302 with the interposer connectors 116 of FIG. 1 can provide electrical connectivity to the base substrate 106, thereby providing connection to the base package 108, the top package 110, or the interposer circuit devices 112. The base substrate 106 can provide electrical connectivity to the base circuit devices 114 or a next level system such as a printed circuit board.

Figure 4:
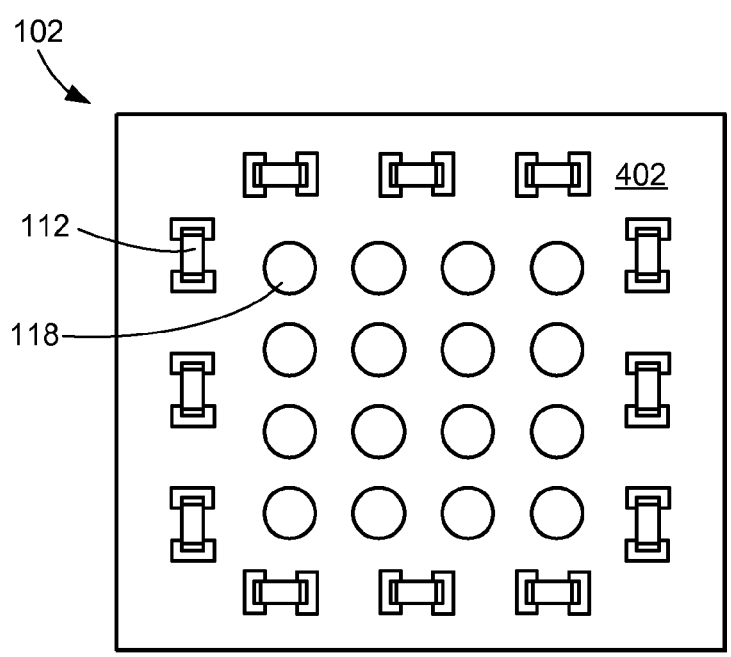
FIG. 4 is a top plan view of an interposer second surface of the integrated interposer.

Referring now to FIG. 4 therein is shown a top plan view of an interposer second surface 402 of the integrated interposer 102. The interposer second surface 402 can include the interposer inner connections 118 or the interposer circuit devices 112. The integrated interposer 102 can include electrical routing (not shown) between any of the interposer inner connections 118 and any of the interposer circuit devices 112. The interposer inner connections 118 and the interposer circuit devices 112 can also electrically connect to the interposer outer leads 302 of FIG. 3 to provide electrical connectivity to the base substrate 106 thereby providing connectivity to the base circuit devices 114 or a next level system.

The interposer inner connections 118 can be formed have a pitch different from a pitch of the interposer outer connections 120. The base package connectors 132 can thereby be formed having a different pitch from a pitch of the top package connectors 134 as well as different planar dimensions of the top package 110 from the planar dimensions of the base package 108. Different pitches and planar dimensions can be optimized for each of the top package 110 and the base package 108 providing improved electrical connectivity, such as shorter electrical paths and improved solder join reliability due in part to reduction of thermal expansion mismatches.

Figure 5:
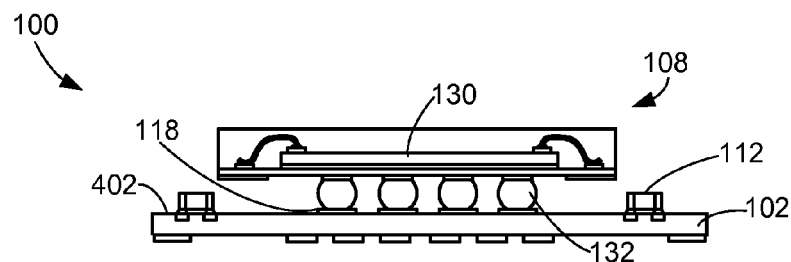
FIG. 5 is a cross-sectional view of the integrated circuit package system in an integrated interposer assembly forming phase.

Referring now to FIG. 5, therein is shown a cross-sectional view of the integrated circuit package system 100 in an integrated interposer assembly forming phase. The integrated circuit package system 100 includes the interposer circuit devices 112 pre-mounted over the interposer second surface 402. The base package 108 can optionally be pre-mounted over the interposer inner connections 118 of the integrated interposer 102. The base package connectors 132 can electrically connect the integrated interposer 102 and the base package 108 thereby providing connectivity for the base die 130. The integrated interposer 102 including the interposer circuit devices 112 and optionally the base package 108, can be tested, such as strip testing, to validate the interposer circuit devices 112, the base package 108, interconnections to the integrated interposer 102, or combinations thereof.

Figure 6:
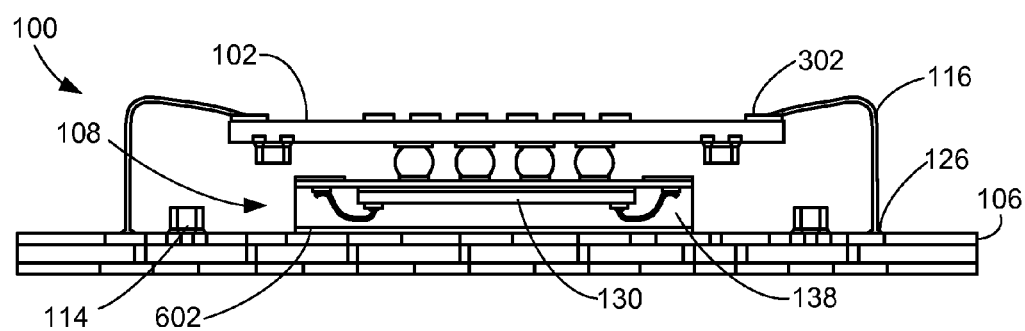
FIG. 6 is a cross-sectional view of the structure of FIG. 5 in a base package mounting phase.

Referring now to FIG. 6, therein is shown a cross-sectional view of the structure of FIG. 5 in a base package mounting phase. The integrated circuit package system 100 includes the base substrate 106 having the base circuit devices 114 mounted on a side having the base substrate inner connections 126. A base mounting layer 602, such as an adhesive layer or an adhesive spacer, can mount the base package 108 over the base substrate 106. The base mounting layer 602 can be applied between a mold cap of the base package encapsulant 138 and the substrate top surface 206. The interposer connectors 116 can electrically connect the base substrate 106 and the integrated interposer 102 thereby connecting the base package 108 having the base die 130. The interposer connectors 116 can be connected to the interposer outer leads 302 of the interposer first surface 202 and the base inner connections 126 of the substrate top surface 206 of the base substrate 106.

Figure 7:
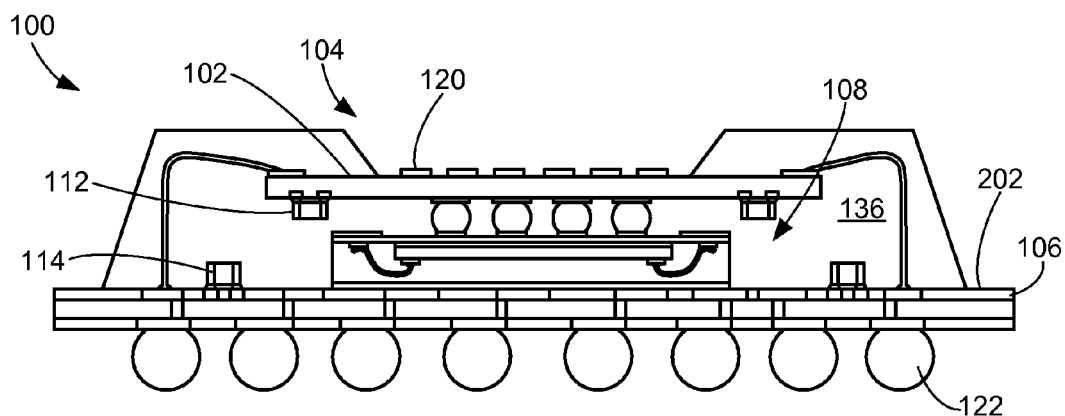
FIG. 7 is a cross-sectional view of the structure of FIG. 6 in a base assembly forming phase.

Referring now to FIG. 7, therein is shown a cross-sectional view of the structure of FIG. 6 in a base assembly forming phase. The package system encapsulant 136 can be formed by a process, such as molding, over the integrated interposer 102, the base package 108, the interposer circuit devices 112, the base circuit devices 114, and the base substrate 106. The package system encapsulant 136 provides structural integrity and protection to the integrated interposer 102, the base package 108, the interposer circuit devices 112, the base circuit devices 114, and the base substrate 106. The package system encapsulant 136 includes the encapsulant cavity 104 formed over the interposer first surface 202. The encapsulant cavity 104 can provide the interposer outer connections 120 substantially exposed. The base substrate connectors 122 are formed on the base substrate 106 on a side opposite the base circuit devices 114 and the base package 108.

Figure 8:
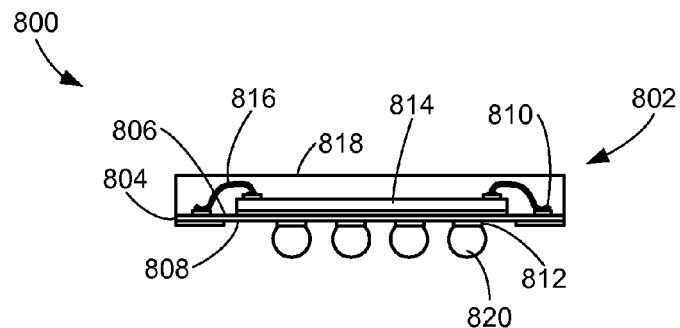
FIG. 8 is a cross-sectional view of an integrated circuit package system in a base package forming phase in another embodiment of the present invention.

Referring now to FIG. 8, therein is shown a cross-sectional view of an integrated circuit package system 800 in a base package forming phase in another embodiment of the present invention. The integrated circuit package system 800 includes a base package 802. The base package 802 includes a base substrate 804 having a base mount surface 806 and a base connection surface 808. The base mount surface 806 of the base substrate 804 can include base package leads 810 and the base connection surface 808 can include base package connections 812. A base die 814 can be mounted over the base mount surface 806 and electrically connected to the base substrate 804 by base die connectors 816.

A base encapsulant 818 can be formed over the base die 814, the base die connectors 816, and the base connection surface 808 of the base substrate 804. The base encapsulant 818 can provide structural integrity and protection for the base package 802. On a side opposite the base encapsulant 818, base package connectors 820 can be formed. The base package connectors 820 can electrically connect the base package connections 812 to a next level system.

Figure 9:
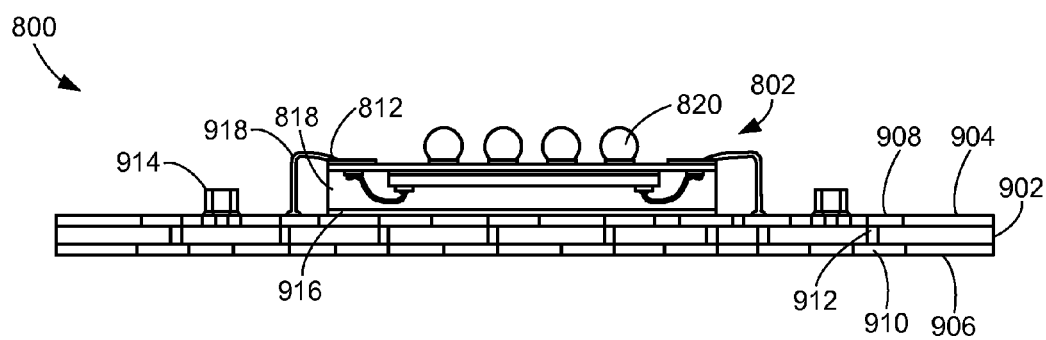
FIG. 9 is a cross-sectional view of the structure of FIG. 8 in a base package mounting phase.

Referring now to FIG. 9, therein is shown a cross-sectional view of the structure of FIG. 8 in a base package mounting phase. The integrated circuit package system 800 includes a base substrate 902. The base substrate 902 can include a base mount surface 904 and a base connection surface 906. The base mount surface 904 can include base inner connections 908. Similarly, the base connection surface 906 can include base outer connections 910. Base routing 912 such as redistribution layers or vias, can connect the base inner connections 908 and the base outer connections 910. Base circuit devices 914, such as passive devices, can be mounted over the base mount surface 904. The base circuit devices 914 can be connected to the base inner connections 908.

The integrated circuit package system 800 also includes the base package 802 having the base encapsulant 818 and the base package connections 812. A mold cap of the base encapsulant 818, formed on a side opposite the base package connectors 820, can be mounted over the base substrate 902 with a base mounting layer 916. The base mounting layer 916 can be formed by a material such as an adhesive layer or an adhesive spacer. The base package 802 can be electrically connected to the base substrate 902 by base substrate connectors 918 such as bond wires. The base substrate connectors 918 can connect the base package connections 812 to the base inner connections 908.

Figure 10:
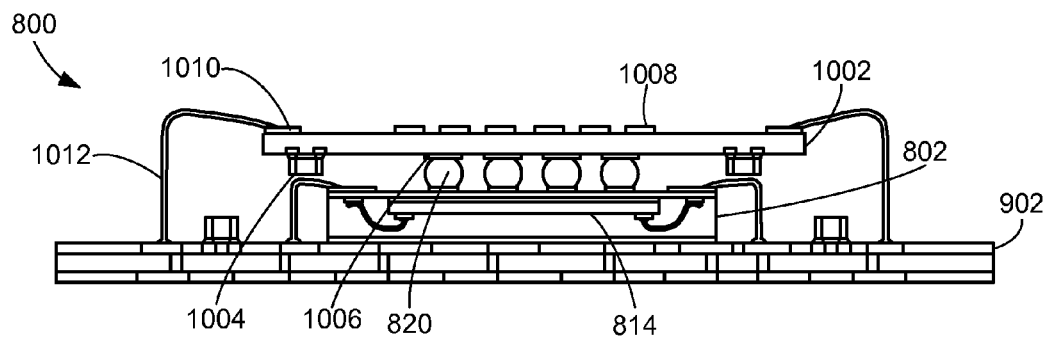
FIG. 10 is a cross-sectional view of the structure of FIG. 9 in an interposer attaching phase.

Referring now to FIG. 10, therein is shown a cross-sectional view of the structure of FIG. 9 in an interposer attaching phase. The integrated circuit package system 800 includes an integrated interposer 1002 having interposer circuit devices 1004 pre-mounted. The integrated interposer 1002 can be attached over the base package 802. The base package connectors 820 can provide electrical connectivity between the integrated interposer 1002 and the base die 814 of the base package 802.

The integrated interposer 1002 can also include interposer inner connections 1006, interposer outer connections 1008, and interposer outer leads 1010. The integrated interposer 1002 can include electrical routing, such as redistribution layers or vias, (not shown) between any of the interposer outer connections 1008, any of the interposer outer leads 1010, or any of the interposer inner connections 1006. Interposer connectors 1012 can connect the interposer outer leads 1010 to the base substrate 902.

Figure 11:
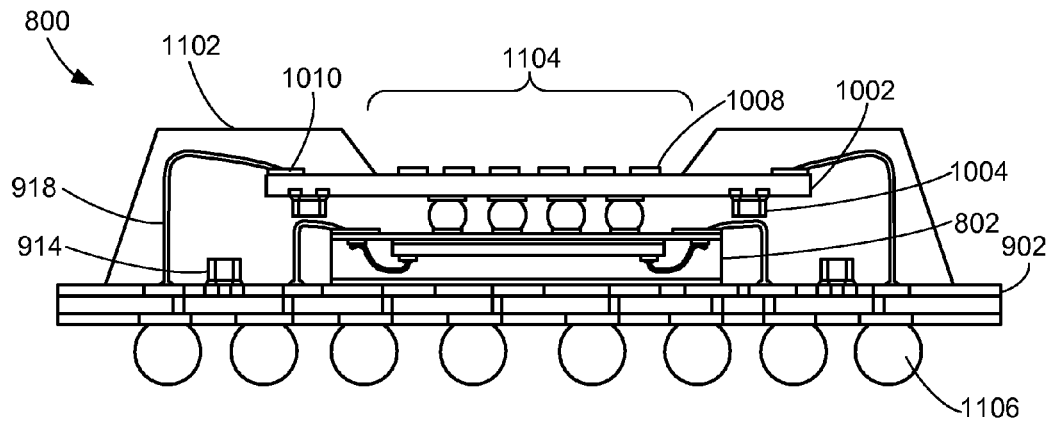
FIG. 11 is a cross-sectional view of the structure of FIG. 10 in a base assembly forming phase.

Referring now to FIG. 11, therein is shown a cross-sectional view of the structure of FIG. 10 in a base assembly forming phase. The integrated circuit package system 800 can include a package system encapsulant 1102 having an encapsulant cavity 1104, and package connectors 1106. The package system encapsulant 1102 can be applied over the structure of FIG. 10 to form the encapsulant cavity 1104 having an exposed region of the integrated interposer 1002. The interposer outer connections 1008 are substantially exposed in the encapsulant cavity 1104. The package system encapsulant 1102 covers and protects a portion of the integrated interposer 1002, the interposer circuit devices 1004, the interposer outer leads 1010, the base substrate connectors 918, the base circuit devices 914, a portion of the base substrate 902, and the base package 802. The package connectors 1106 are formed on the base substrate 902 on a side opposite the base circuit devices 914 and the base package 802.

Figure 12:
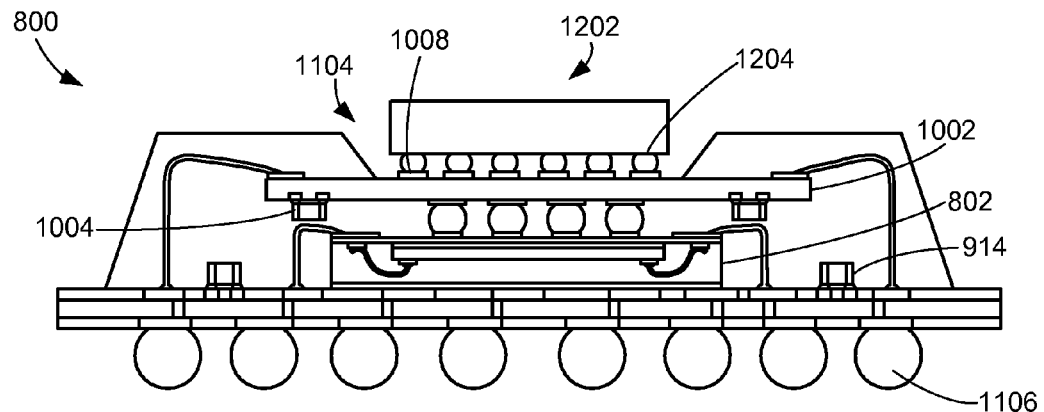
FIG. 12 is a cross-sectional view of the structure of FIG. 11 in a package system forming phase.

Referring now to FIG. 12, therein is shown a cross-sectional view of the structure of FIG. 11 in a package system forming phase. The integrated circuit package system 800 includes the integrated interposer 1002 in the encapsulant cavity 1104. The integrated interposer 1002 provides support and structural integrity for stacking a top package 1202 over the base package 802. The interposer outer connections 1008 are substantially exposed providing a mounting surface for the top package 1202. The top package 1202 includes top package connectors 1204. The top package connectors 1204 can be electrically connected to the interposer outer connections 1008 and thereby the base package 802, the interposer circuit devices 1004, the base circuit devices 914, or the package connectors 1106.

Figure 13:
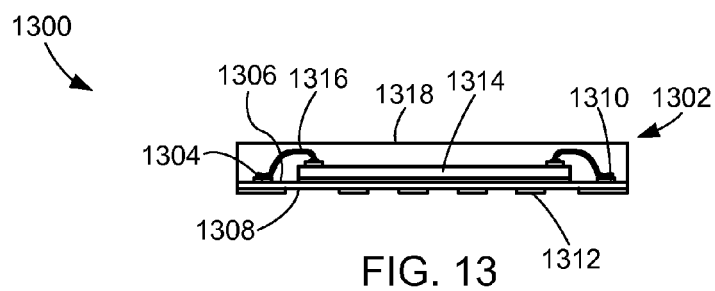
FIG. 13 is a cross-sectional view of an integrated circuit package system in a base package forming phase in yet another embodiment of the present invention.

Referring now to FIG. 13, therein is shown a cross-sectional view of an integrated circuit package system 1300 in a base package forming phase in yet another embodiment of the present invention. In a manner similar to the integrated circuit package system 800, the integrated circuit package system 1300 includes a base package 1302. The base package 1302 includes a base substrate 1304 having a base mount surface 1306 and a base connection surface 1308. The base mount surface 1306 of the base substrate 1304 can include base package leads 1310 and the base connection surface 1308 can include base package connections 1312. A base die 1314 can be mounted over the base mount surface 1306 and electrically connected to the base substrate 1304 by base die connectors 1316.

A base encapsulant 1318 can be formed over the base die 1314, the base die connectors 1316, and the base connection surface 1308 of the base substrate 1304. The base encapsulant 1318 can provide structural integrity and protection for the base package 1302.

Figure 14:
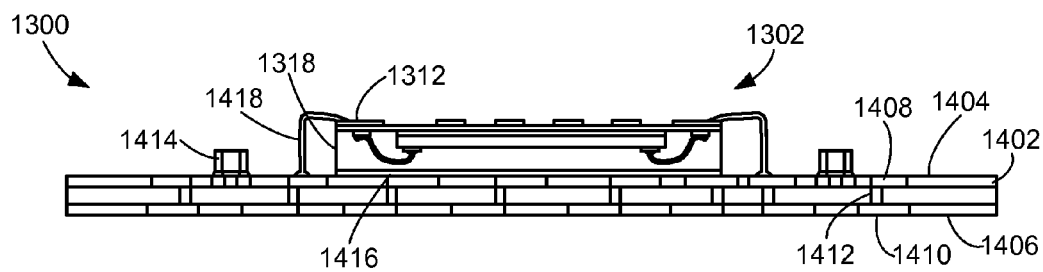
FIG. 14 is a cross-sectional view of the structure of FIG. 13 in a base package mounting phase.

Referring now to FIG. 14, therein is shown a cross-sectional view of the structure of FIG. 13 in a base package mounting phase. The integrated circuit package system 1300 includes a base substrate 1402. The base substrate 1402 can include a base mount surface 1404 and a base connection surface 1406. The base mount surface 1404 can include base inner connections 1408. Similarly, the base connection surface 1406 can include base outer connections 1410. Base routing 1412 such as redistribution layers or vias, can connect the base inner connections 1408 and the base outer connections 1410. Base circuit devices 1414, such as passive devices, can be mounted over the base mount surface 1404. The base circuit devices 1414 can be connected to the base inner connections 1408.

The integrated circuit package system 1300 also includes the base package 1302 having the base encapsulant 1318 and the base package connections 1312. A mold cap of the base encapsulant 1318 can be mounted over the base substrate 1402 with a base mounting layer 1416. The base mounting layer 1416 can be formed by a material such as an adhesive layer or an adhesive spacer. The base package 1302 can be electrically connected to the base substrate 1402 by base substrate connectors 1418 such as bond wires. The base substrate connectors 1418 can connect the base package connections 1312 to the base inner connections 1408.

Figure 15:
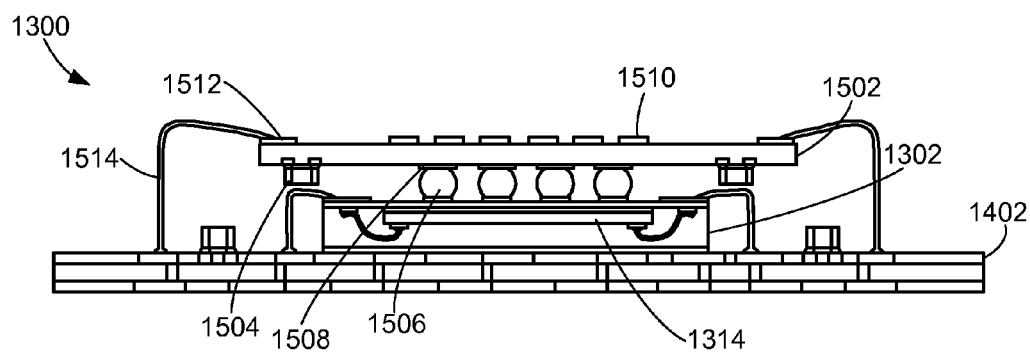
FIG. 15 is a cross-sectional view of the structure of FIG. 14 in an interposer attaching phase.

Referring now to FIG. 15, therein is shown a cross-sectional view of the structure of FIG. 14 in an interposer attaching phase. The integrated circuit package system 1300 includes an integrated interposer 1502 having interposer circuit devices 1504 and base package connectors 1506 pre-mounted. The integrated interposer 1502 can be attached over the base package 1302. The base package connectors 1506 can provide electrical connectivity between the integrated interposer 1502 and the base die 1314 of the base package 1302.

The integrated interposer 1502 can also include interposer inner connections 1508, interposer outer connections 1510, and interposer outer leads 1512. The integrated interposer 1502 can include electrical routing, such as redistribution layers or vias, (not shown) between any of the interposer outer connections 1510, any of the interposer outer leads 1512, or any of the interposer inner connections 1508. Interposer connectors 1514 can connect the interposer outer leads 1512 to the base substrate 1402.

Figure 16:
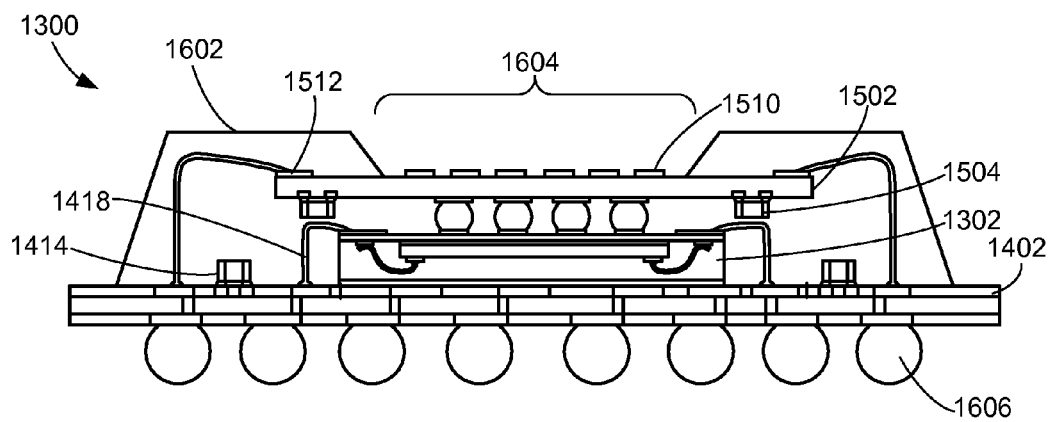
FIG. 16 is a cross-sectional view of the structure of FIG. 15 in a base assembly forming phase.

Referring now to FIG. 16, therein is shown a cross-sectional view of the structure of FIG. 15 in a base assembly forming phase. The integrated circuit package system 1300 can include a package system encapsulant 1602 having an encapsulant cavity 1604, and package connectors 1606. The package system encapsulant 1602 can be applied over the structure of FIG. 15 to form the encapsulant cavity 1604 having an exposed region of the integrated interposer 1502. The interposer outer connections 1510 are substantially exposed in the encapsulant cavity 1604. The package system encapsulant 1602 covers and protects a portion of the integrated interposer 1502, the interposer circuit devices 1504, the interposer outer leads 1512, the base substrate connectors 1418, the base circuit devices 1414, a portion of the base substrate 1402, and the base package 1302. The package connectors 1606 are formed on the base substrate 1402 on a side opposite the base circuit devices 1414 and the base package 1302.

Figure 17:
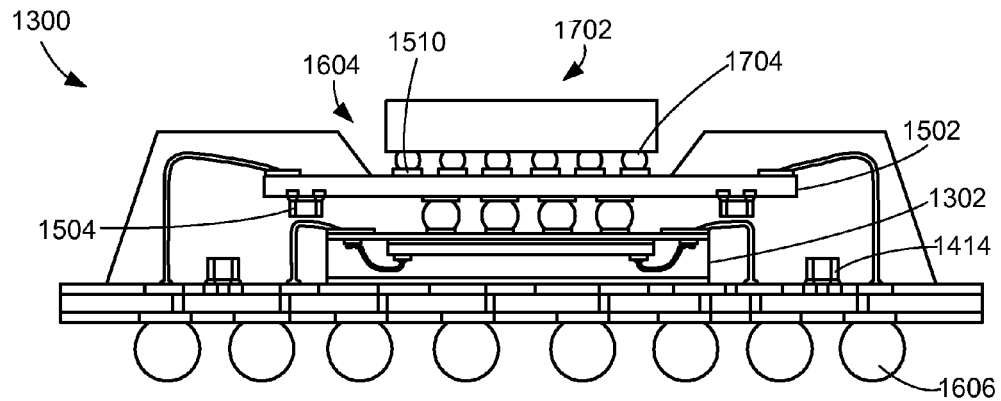
FIG. 17 is a cross-sectional view of the structure of FIG. 16 in an integrated circuit package forming phase.

Referring now to FIG. 17, therein is shown a cross-sectional view of the structure of FIG. 16 in an integrated circuit package forming phase. The integrated circuit package system 1300 includes the integrated interposer 1502 in the encapsulant cavity 1604. The integrated interposer 1502 provides support and structural integrity for stacking a top package 1702 over the base package 1302. The interposer outer connections 1510 are substantially exposed providing a mounting surface for the top package 1702. The top package 1702 includes top package connectors 1704. The top package connectors 1704 can be electrically connected to the interposer outer connections 1510 and thereby the base package 1302, the interposer circuit devices 1504, the base circuit devices 1414, or the package connectors 1606.

Figure 18:
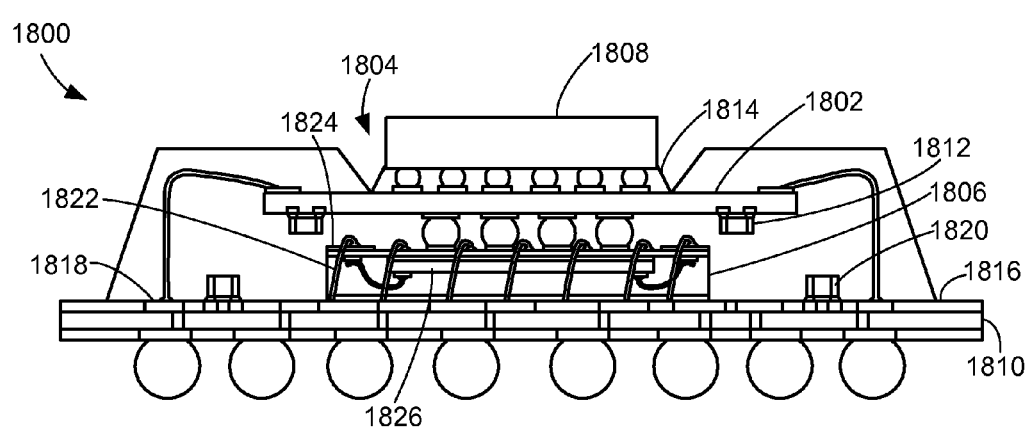
FIG. 18 is a cross-sectional view of an integrated circuit package system in yet another embodiment of the present invention.

Referring now to FIG. 18, therein is shown a cross-sectional view of an integrated circuit package system 1800 in yet another embodiment of the present invention. The integrated circuit package system 1800 includes an integrated interposer 1802, an encapsulant cavity 1804, a base package 1806, a top package 1808, and a base substrate 1810. The integrated interposer 1802 includes interposer circuit devices 1812, such as passive devices, pre-attached and optionally the base package 1806 pre-attached. An underfill 1814 can be applied between the top package 1808 and the integrated interposer 1802.

The base substrate can include a base mount surface 1816 having base inner connections 1818 and base circuit devices 1820. The base circuit devices 1820 can be connected to the base inner connections 1818. Base package connectors 1822 can electrically connect the base package 1806 to the base substrate 1810. Base package leads 1824, such as base package bond finger pads, are unobstructed by the integrated interposer 1802. The base package connectors 1822 can connect to the base package leads 1824 and the base inner connections 1818 thereby connecting a base die 1826 of the base package 1806.

As an example, the base package leads 1824 can be substantially exposed by optionally offset stacking the integrated interposer 1802 over the base package 1806. An offset can be at least the greater of a planar dimension of an attached end of the base package connectors 1822 or a clearance for a connection process apparatus (not shown) such as a bond head or a wire bonder.

As another example, the base package 1806, the integrated interposer 1802, or both can optionally be formed having rectangular planar dimensions. One of the rectangular planar dimensions of the base package 1806 can exceed one of the dimensions of the integrated interposer 1802 by at least the greater of a planar dimension of an end of the base package connectors 1822 or a clearance for a connection process apparatus.

As yet another example, the integrated interposer 1802 can be formed having openings (not shown), such as slots. The openings over the base package 1806 provide at least the greater of a planar dimension of an end of the base package connectors 1822 or a clearance for a connection process apparatus.

Figure 19:
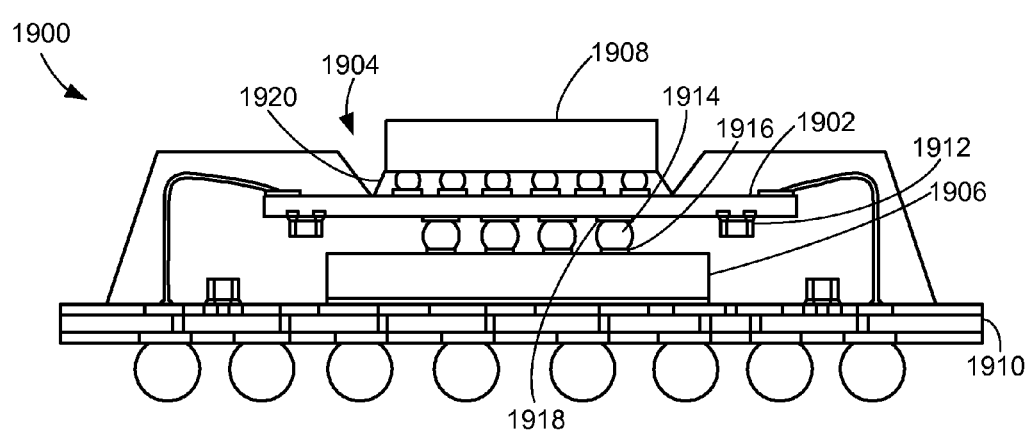
FIG. 19 is a cross-sectional view of an integrated circuit package system in yet another embodiment of the present invention.

Referring now to FIG. 19, therein is shown a cross-sectional view of an integrated circuit package system 1900 in yet another embodiment of the present invention. The integrated circuit package system 1900 includes an integrated interposer 1902, an encapsulant cavity 1904, a base die 1906, a top package 1908, and a base substrate 1910. The integrated interposer 1902 includes interposer circuit devices 1912, such as passive devices, and the base die 1906 pre-attached. The base die 1906 can be formed as a flip chip die. The base die 1906 can be mounted by base die connectors 1914, such as solder bumps or solder balls, between base die connections 1916 and interposer inner connections 1918. An underfill 1920 can be applied between the top package 1908 and the integrated interposer 1902.

Figure 20:
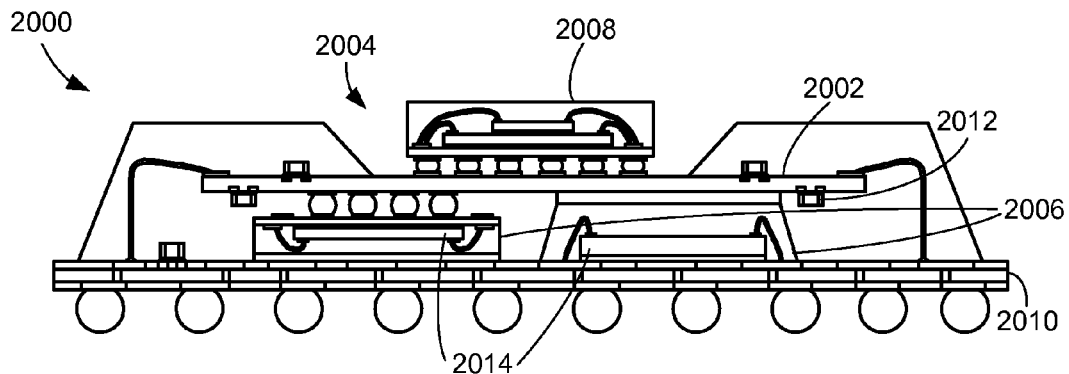
FIG. 20 is a cross-sectional view of an integrated circuit package system in yet another embodiment of the present invention.

Referring now to FIG. 20, therein is shown a cross-sectional view of an integrated circuit package system 2000 in yet another embodiment of the present invention. The integrated circuit package system 2000 includes an integrated interposer 2002, an encapsulant cavity 2004, base packages 2006, a top package 2008, and a base substrate 2010. The integrated interposer 2002 includes interposer circuit devices 2012, such as passive devices, the base packages 2006, and the top package 2008. The base packages 2006 can include base die 2014. The integrated interposer 2002 having the base packages 2006 and the top package 2008 can be mounted over the base substrate 2010. The interposer circuit devices 2012 or the base packages 2006 can be pre-attached to the integrated interposer 2002. The top package 2008 can be attached in the encapsulant cavity 2004 after a base assembly forming phase.

For illustrative purposes, the base packages 2006 are shown as an area array package and a wire bonded package, although it is understood that the base packages 2006 may be different. Further, for illustrative purposes, two of the base packages 2006 are shown although it is understood that any number may be included. Yet further, for illustrative purposes, the top package 2008 is shown as a stacked die area array package, although it is understood that the top package 2008 may be different. Yet further, for illustrative purposes, one instance of the top package 2008 is shown although it is understood that any number may be included.

Figure 21:
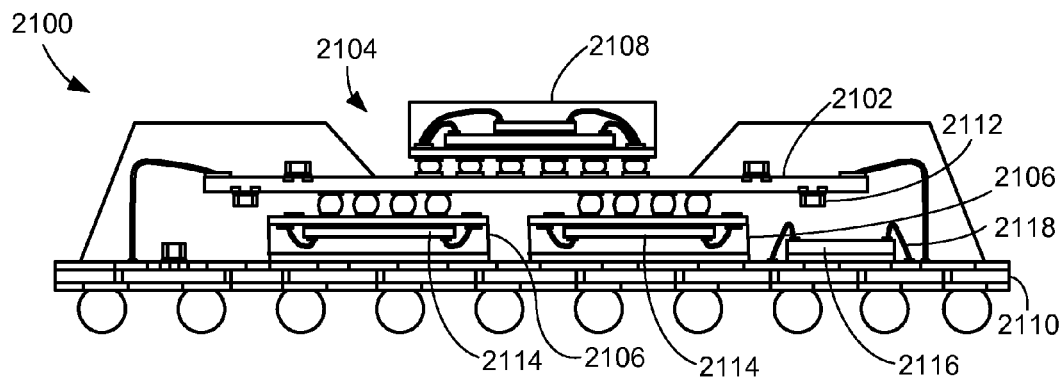
FIG. 21 is a cross-sectional view of an integrated circuit package system in yet another embodiment of the present invention.

Referring now to FIG. 21, therein is shown a cross-sectional view of an integrated circuit package system 2100 in yet another embodiment of the present invention. The integrated circuit package system 2100 includes an integrated interposer 2102, an encapsulant cavity 2104, base packages 2106, a top package 2108, and a base substrate 2110. The integrated interposer 2102 can be formed as a multi chip module. The integrated interposer 2102 can include interposer circuit devices 2112, such as passive devices, the base packages 2106, and the top package 2108. The base packages 2106 can include base die 2114.

The base substrate 2110 can include a base circuit device 2116, such as an active circuit device. The base circuit device 2116 can be pre-mounted to the base substrate 2110 and electrically connected to the base substrate 2110 by base device connectors 2118, such as wire bonds. The base device connectors 2118 can provide electrical connectivity between the base circuit device 2116 and the base substrate 2110. The integrated interposer 2102 having the base packages 2106 or the top package 2108 as a multi chip module can be mounted over the base substrate 2110 and the base circuit device 2116.

For illustrative purposes, the base packages 2106 are shown as area array packages, although it is understood that the base packages 2106 may be different. Further, for illustrative purposes, two of the base packages 2106 are shown although it is understood that any number may be included. Yet further, for illustrative purposes, the top package 2108 is shown as a stacked die area array package, although it is understood that the top package 2108 may be different. Yet further, for illustrative purposes, one instance of the top package 2108 is shown although it is understood that any number of may be included.

Figure 22:
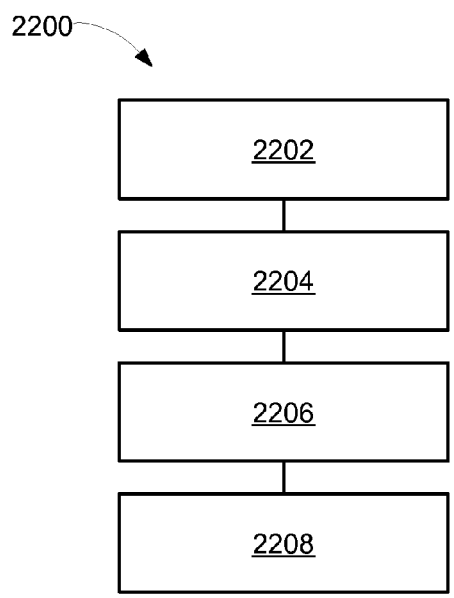
FIG. 22 is a flow chart of an integrated circuit package system for manufacturing the integrated circuit package system in an embodiment of the present invention.

Referring now to FIG. 22, therein is shown a flow chart of an integrated circuit package system 2200 for manufacturing the integrated circuit package system 100 in an embodiment of the present invention. The system 2200 includes providing a base substrate in a block 2202; attaching a base die over the base substrate in a block 2204; attaching an integrated interposer having interposer circuit devices, over the base die in a block 2206; and forming a package system encapsulant having an encapsulant cavity over the integrated interposer on a side opposite the base die in a block 2208.

In greater detail, a system to provide the method and apparatus of the integrated circuit package system 100, in an embodiment of the present invention, is performed as follows:

1. Providing a base substrate having base inner connections and base outer connections.
2. Mounting a base die over the base inner connections.
3. Mounting an integrated interposer having interposer circuit devices, interposer inner connections, and interposer outer connections over the base die.
4. Molding a package system encapsulant having an encapsulant cavity over the interposer outer connections on a side opposite the base die.
5. Mounting a top package over the interposer outer connections on the side opposite the base die.

It has been discovered that the present invention thus has numerous aspects of the embodiments.

An important aspect of the embodiments is that it valuably supports and services the historical trend of reducing costs, simplifying systems, and increasing performance.

These and other valuable aspects of the embodiments consequently further the state of the technology to at least the next level.

Thus, it has been discovered that the integrated circuit package system method and apparatus of the present invention furnish important and heretofore unknown and unavailable solutions, capabilities, and functional aspects. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. An integrated circuit package system comprising:
   providing a base substrate;
   attaching a base die over the base substrate;
   attaching an integrated interposer having interposer circuit devices, over the base die;
   connecting the base die electrically by a base package connector to the integrated interposer on the same side as the base die;
   forming a package system encapsulant having an encapsulant cavity exposing at least a portion of the integrated interposer on a side opposite the base die.

2. The system as claimed in claim 1 further comprising attaching a top package over the integrated interposer.

3. The system as claimed in claim 1 further comprising attaching a top package having an underfill.

4. The system as claimed in claim 1 wherein attaching integrated interposer includes electrically connecting base substrate connectors between the base die and the integrated interposer.

5. The system as claimed in claim 1 wherein attaching the base die includes attaching a base package having the base die, over the base substrate.

6. An integrated circuit package system comprising:
   providing a base substrate having base inner connections and base outer connections;
   mounting a base die over the base inner connections;
   mounting an integrated interposer having interposer circuit devices, interposer inner connections, and interposer outer connections, over the base die;
   connecting the base die electrically by a base package connector to the integrated interposer on the same side as the base die;
   molding a package system encapsulant having an encapsulant cavity exposing at least a portion of the interposer outer connections on a side opposite the base die; and
   mounting a top package over the interposer outer connections on the side opposite the base die.

7. The system as claimed in claim 6 wherein mounting the base die includes pre-mounting the base die over the interposer inner connections.

8. The system as claimed in claim 6 wherein mounting the base die includes mounting a flip chip die over the interposer inner connections.

9. The system as claimed in claim 6 wherein mounting the integrated interposer includes mounting the integrated interposer having an offset from the base die.

10. The system as claimed in claim 6 wherein mounting the integrated interposer includes forming the integrated interposer having rectangular planar dimensions, openings, or a combination thereof.

11. The system as claimed in claim 6 wherein mounting the integrated interposer includes mounting base packages including the base die, and the top package over the integrated interposer.

12. The system as claimed in claim 6 wherein mounting the integrated interposer includes mounting a multi chip module having base packages including the base die.

* * * * *